United States Patent [19]
Montegari

[11] Patent Number: 5,285,118
[45] Date of Patent: Feb. 8, 1994

[54] COMPLEMENTARY CURRENT TREE DECODER

[75] Inventor: Fred A. Montegari, Wappingers Falls, N.Y.

[73] Assignee: International Business Machines Corporation, Armonk, N.Y.

[21] Appl. No.: 914,830

[22] Filed: Jul. 16, 1992

[51] Int. Cl.⁵ .......................................... H03K 19/013
[52] U.S. Cl. ................... 307/463; 307/443; 307/455; 365/230.06
[58] Field of Search ................. 365/230.06; 307/443, 307/449, 463, 455, 451

[56] References Cited

U.S. PATENT DOCUMENTS

| | | | |
|---|---|---|---|
| 4,027,285 | 5/1977 | Millhollan et al. | 307/463 X |
| 4,348,747 | 9/1982 | Takahashi | 365/190 X |
| 4,385,370 | 5/1983 | Isogai | 307/463 X |
| 4,494,017 | 1/1985 | Montegari | 307/463 |
| 4,684,829 | 8/1987 | Uratani | 307/449 |
| 4,725,742 | 2/1988 | Tachimori et al. | 307/443 X |
| 4,796,227 | 1/1989 | Lyon et al. | 365/190 X |
| 4,857,772 | 8/1989 | Herndon | 307/463 |
| 4,935,646 | 6/1990 | Peterson, Jr. et al. | 307/463 X |
| 4,986,666 | 1/1991 | Homma et al. | 365/230.08 |
| 5,021,688 | 6/1991 | Leforestier et al. | 307/463 |

OTHER PUBLICATIONS

Davis et al., "Matrix Decoder", IBM T.D.B., vol. 18, No. 8, Jan. 1976, pp. 2577-2578.

Primary Examiner—David R. Hudspeth
Attorney, Agent, or Firm—Whitham & Marhoefer

[57] ABSTRACT

A complementary Current Tree Decoder (CTD) structure includes output drivers in the form of current sources that may be designed to pull up or down and may be clamped to provide large or small voltage transitions for driving bipolar or Field Effect Transistor (FET) second decoders. Both Up Level Decoders (ULDs) and Down Level Decoders (DLDs) may be used together to drive bipolar second decoders, thereby saving power. For similar decode functions, the device count for the complementary Current Tree Decoder (CTD) is similar to that of the True/Complement Generator (TCG) decoder, but for the same current driving capability, the CTD dissipates only one fifth of the power dissipation of the TCG decoder. The CTD uses current folding to produce the equivalent of a four tier cascode current switch (ECL). Current folding is possible through the use of both vertical PNP and NPN transistors to source and sink current in both positive and negative directions. Power dissipation is low because only one branch of the tree at a time conducts current.

7 Claims, 10 Drawing Sheets

COMPLEMENTARY CURRENT TREE DECODER

DESCRIPTION

Background of the Invention

1. Field of the Invention

The present invention generally relates to decoder logic circuits and, more particularly, to a complementary current tree decoder having reduced power requirements.

2. Description of the Prior Art

True/Complement Generators and first decoder circuits currently used on array chips, such as random access memory (RAM) chips, consume a large amount of power. The high power dissipation can usually be tolerated on individual array chips but becomes excessive in macro designs where as many as several dozen large macros and some logic may reside on a single chip. For example, an array design may have as many as three dozen array macros, each as large as 128K. Decoding for an array of this size requires fifteen first decoder True/Complement Generators (TCGs) for each macro, each dissipating a typical 80 milliwatts for a total chip decoder power of 43 watts!

SUMMARY OF THE INVENTION

It is therefore an object of the present invention to provide an improved decoder structure which requires less power than True/Complement Generators and first decoder circuits currently used on array chips.

According to the invention, there is provided a complementary Current Tree Decoder (CTD) structure in which the output drivers are current sources that may be designed to pull up or down and may be clamped to provide large or small voltage transitions for driving bipolar or Field Effect Transistor (FET) second decoders. Both Up Level Decoders (ULDs) and Down Level Decoders (DLDs) may be used together to drive bipolar second decoders, thereby saving power. For similar decode functions, the device count for the complementary Current Tree Decoder (CTD) according to the invention is similar to that of the True/Complement Generator (TCG) decoder, but for the same current driving capability, the CTD dissipates only one fifth of the power dissipation of the TCG decoder.

The Complementary Current Tree Decoder (CTD) uses current folding to produce the equivalent of a four tier cascode Emitter Coupled Logic (ECL) current switch that decodes four lines into sixteen lines and operates within a power supply system defined by a power supply voltage $V_{cc}$ and circuit ground, GND. Current folding as used in this disclosure is defined as using bipolar transistors in a current mirror configuration to transfer the flow of current that originates from $V_{cc}$ and then passes through logic gates and flows into GND into another path, also containing logic circuits, that also flows from $V_{cc}$ into GND in such a manner that the first path has a direct influence on the current flow in the second path. The flow of current through the logic path is thus extended over a greater total voltage range than the GND-to-$V_{cc}$ supply voltage. Current folding is possible through the use of both vertical PNP and NPN transistors to source and sink current in both positive and negative directions. Power dissipation is low because only one branch of the tree at a time conducts current.

In contrast with the example of an array design having as many as three dozen array macros, each as large as 128K, which required fifteen first decoder True/Complement Generators (TCGs) for each macro, each dissipating a typical 80 milliwatts for a total chip decoder power of 43 watts, only four complementary Current Tree Decoders (CTDs) for each macro are required to perform the same decoding with a power dissipation of 57 milliwatts each for a total chip decoder power of only 8.3 watts. While the invention was created specifically for use with array macros, its applications are unlimited.

The complementary CTD according to the invention gives more flexibility to the circuit designer by providing both up level and down level select modes. The CTD dissipates only one fifth of the power of a TCG decoder and is ideal for Read Only and Random Access memory macros. Two versions provide up level and down level select, and adjustable output levels can drive bipolar transistors or FETs.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
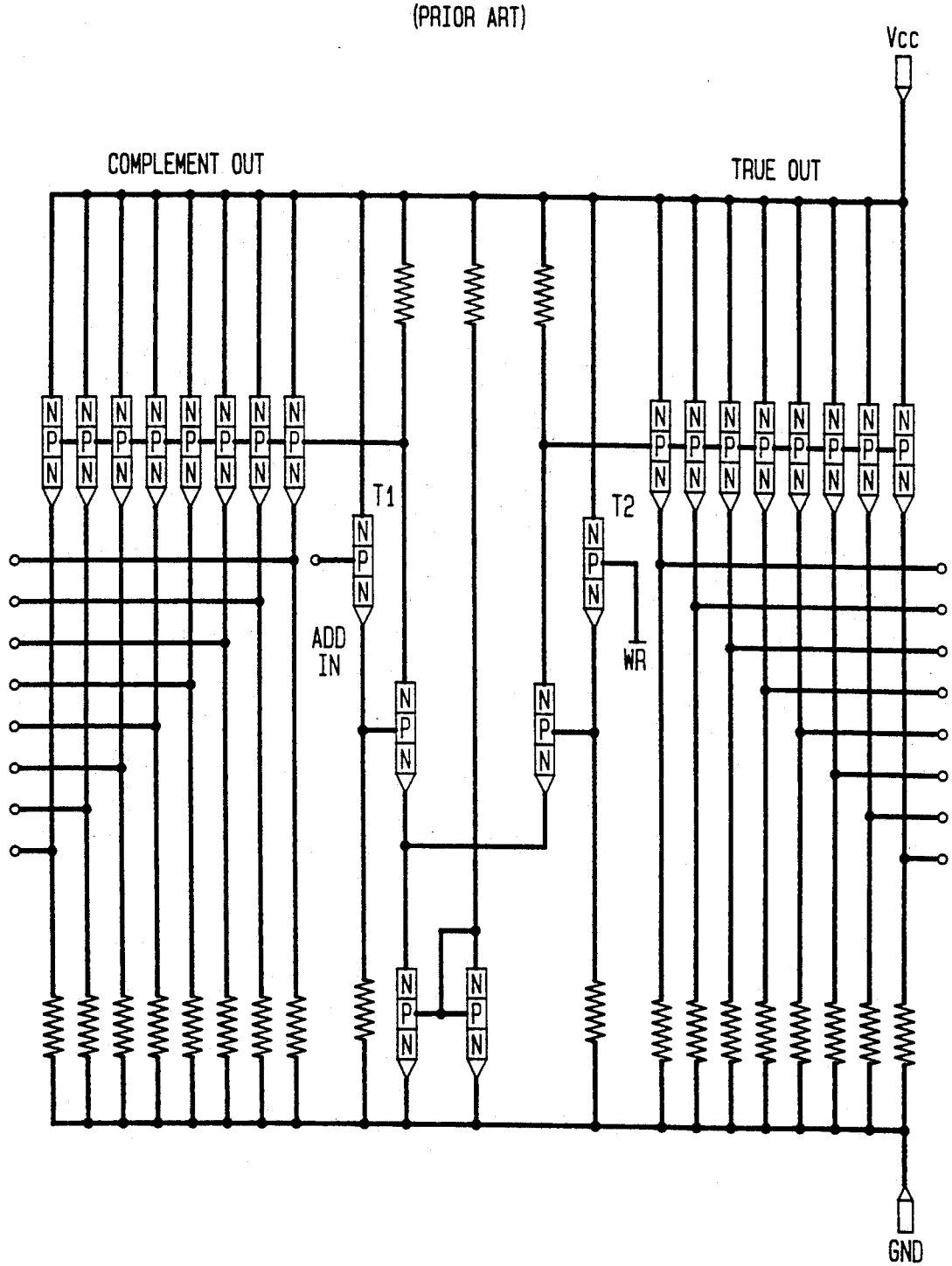
FIG. 1 is a schematic diagram of a conventional true/complement generator (TCG)

Referring now to the drawings, and more particularly to FIG. 1, there is shown a schematic diagram of a typical True/Complement Generator (TCG) circuit having eight true and eight complement emitter follower outputs. In this circuit, the input is applied to a first NPN transistor T1 connected as an emitter follower. A second NPN transistor T2, also connected as an emitter follower, receives a reference voltage VR. These two transistors drive a differential pair of NPN transistors which, in turn, drive respective groups of eight NPN transistors connected as emitter followers to supply eight true and complement outputs. Circuits of this type are used in groups of four to decode four lines into sixteen lines.

Figure 2:
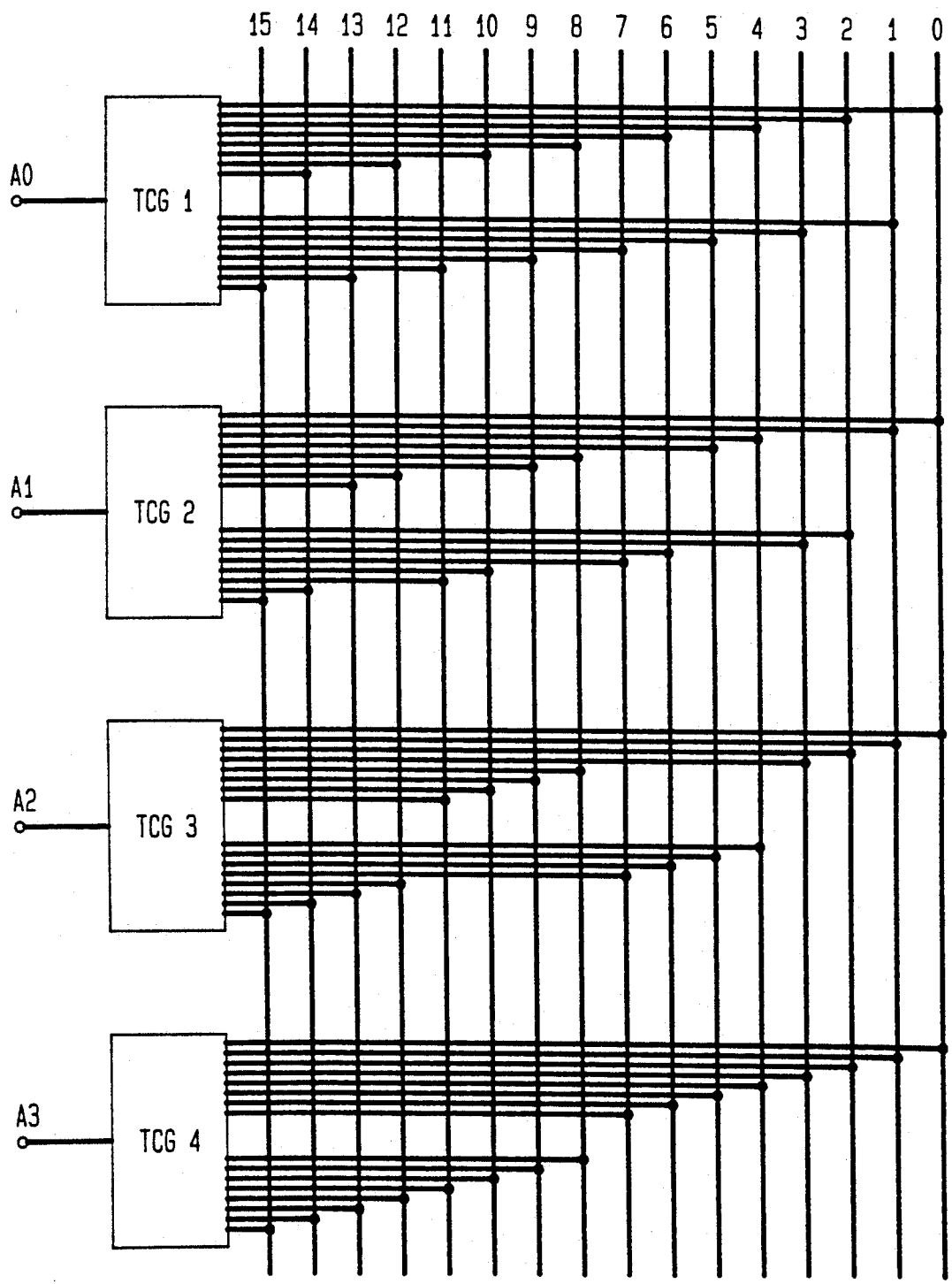
FIG. 2 is a block diagram of four conventional true/complement generators (TCGs) configured as a four line to sixteen line decoder.
Figure 3:
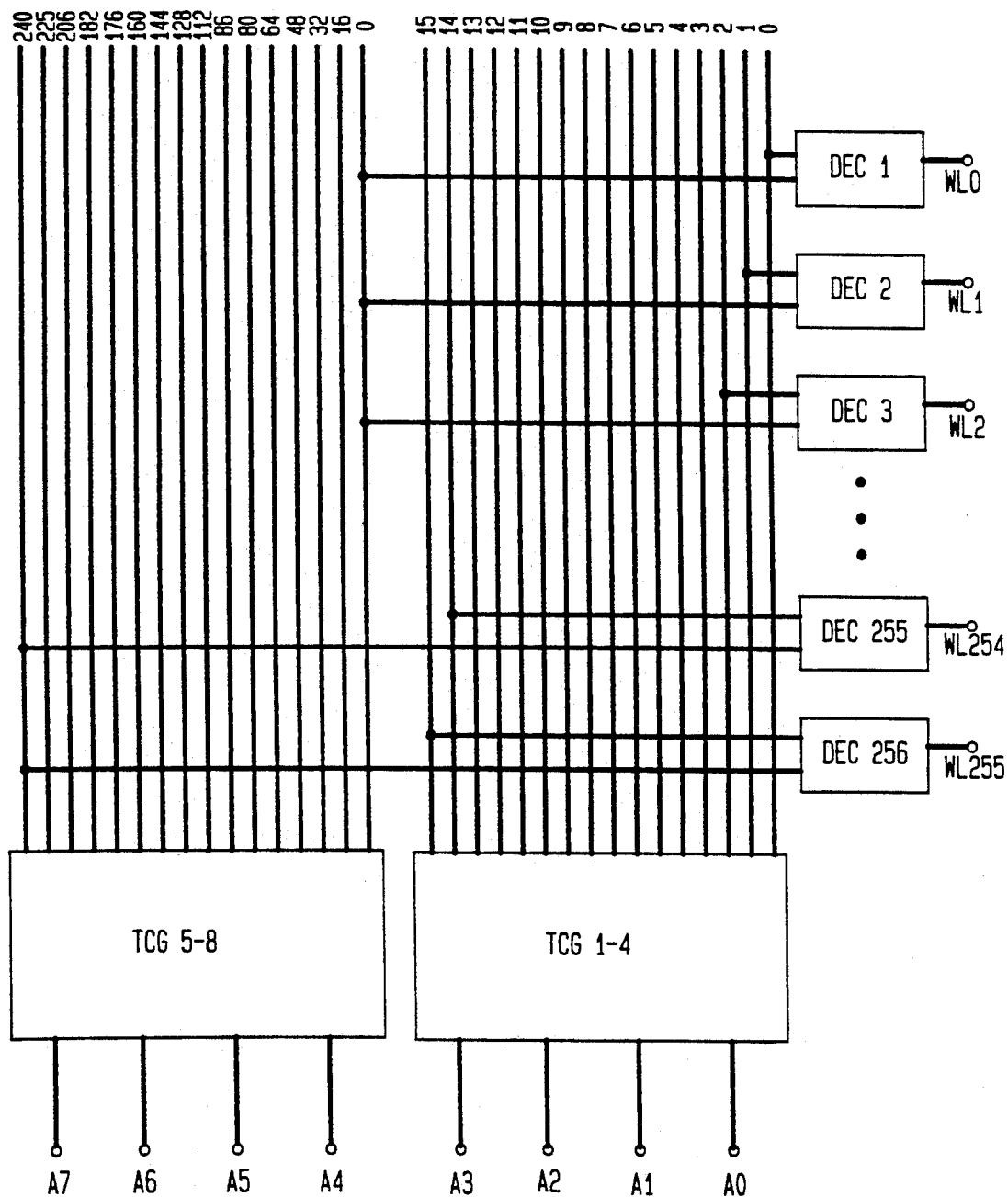
FIG. 3 is a block diagram showing two groups of the conventional true/complement generators (TCGs) driving dual-input second decoders that decode into 256 word lines.

FIG. 2 is a block diagram of four True/Complement Generators (TCGs) with their output emitter followers dotted together to perform the first decoding function and drive the metallurgy lines that feed their second decoder loads. These four TCGs receive four binary inputs on lines A0 to A3 and decode these four lines into the sixteen lines numbered 0 to 15. Two groups of four TCGs each can decode eight lines into thirty-two lines which can be further decoded by dual-input second decoders into 256 word or bit lines that connect to the memory cells of an array as shown in FIG. 3.

The power dissipation of these TCG circuits is high because they use DOT OR emitter follower decoders that also function as driver devices to drive the second decoders. High power dissipation is required in the driver devices to provide a low driving impedance to the long metallurgy lines and second decoder loads while providing minimum delay to meet access time requirements. Since a down level is the selected state for a DOT OR decoder, only one line at a time is down and the rest of the DOTs are at an up level, resulting in a high dissipation state.

Typical current in each emitter follower of a TCG decoder is six milliamperes, which is the drive current used in simulations for comparison between this type of decoder and the complementary Current Tree Decoder (CTD) of the invention as described below. Power dissipation for a typical high speed TCG decoder is 80 milliwatts each totaling 1.2 watts for an array having eight word and seven bit TCGs.

Figure 4:
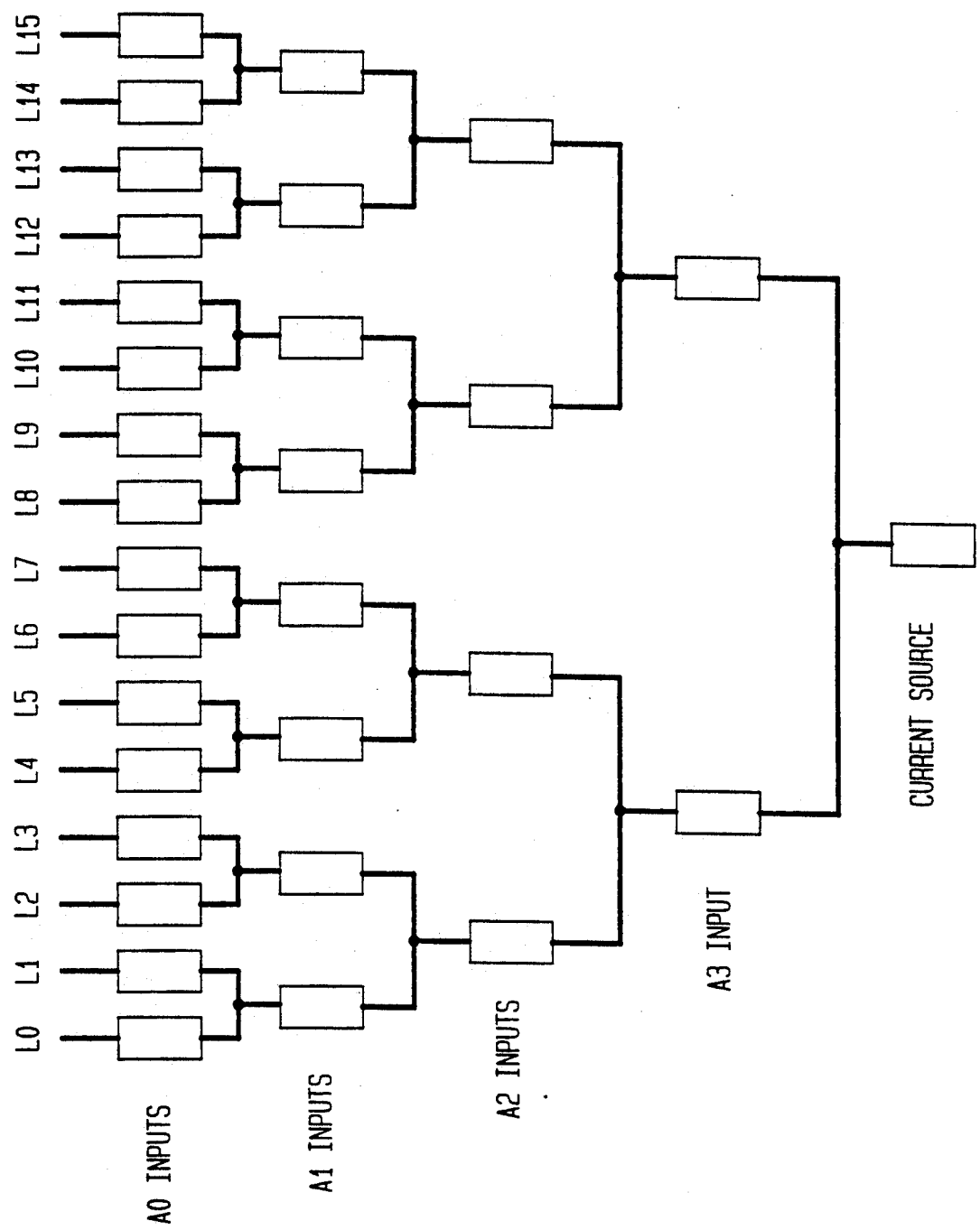
FIG. 4 is a block diagram illustrating the concept of a tree decoder on which the subject invention is based.

The concept of the complementary current tree decoder (CTD) is shown in FIG. 4. The tree employs a current source at the trunk of the tree and each level has double the branches of the next lower level. For the example shown, there are four inputs A0 to A3 going from the highest level to the lowest level. These binary address inputs steer current through the branches to decode the four inputs into sixteen output lines L0 to L15.

Figure 5:
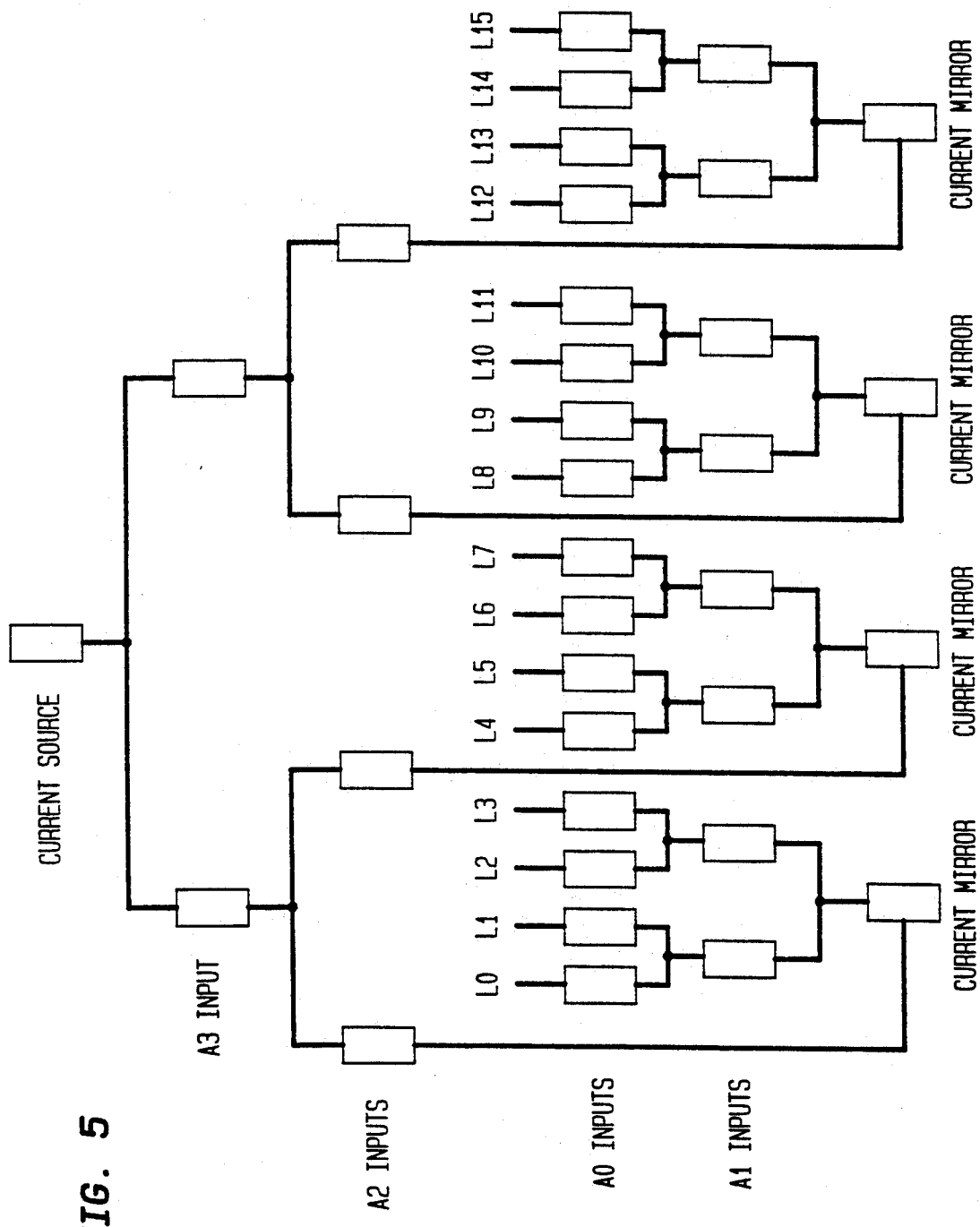
FIG. 5 is a block diagram showing a current tree with current folding as used in the invention.

A block diagram of a practical design with current folding and using complementary bipolar devices is shown in FIG. 5. The tree is divided into four groups driving four of the output lines L1 to L3, L4 to L7, L8 to L11, and L12 to L15. These four groups all receive the A0 and A1 inputs. Current folding is accomplished by providing at the trunk of the tree of each of these groups a current mirror which is driven by the next lower level that receives the A2 input.

Figure 6:
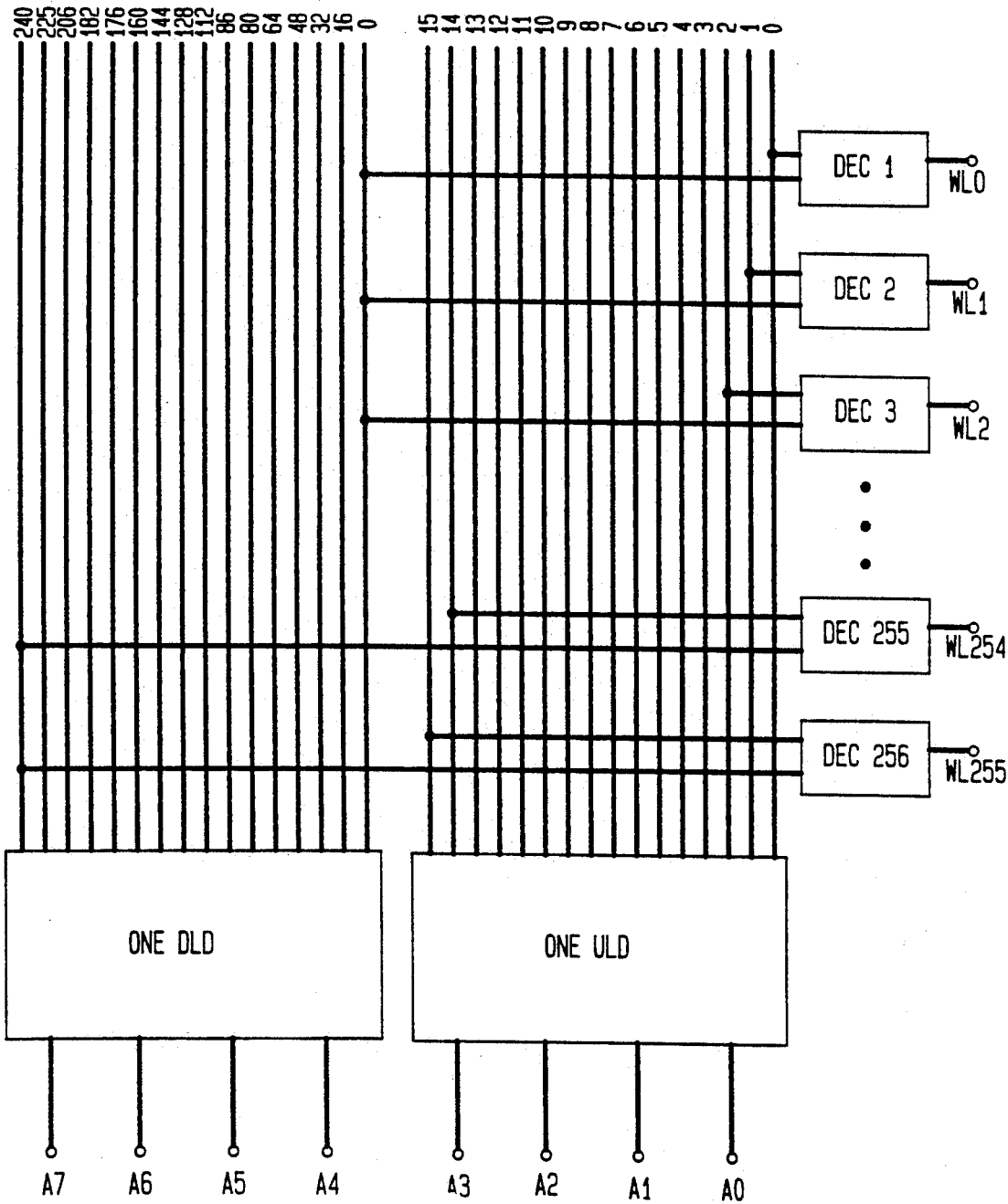
FIG. 6 is a block diagram showing two current tree decoders (CTDs), one providing down level select and one providing up level select, according to a preferred embodiment of the invention.
Figure 7:
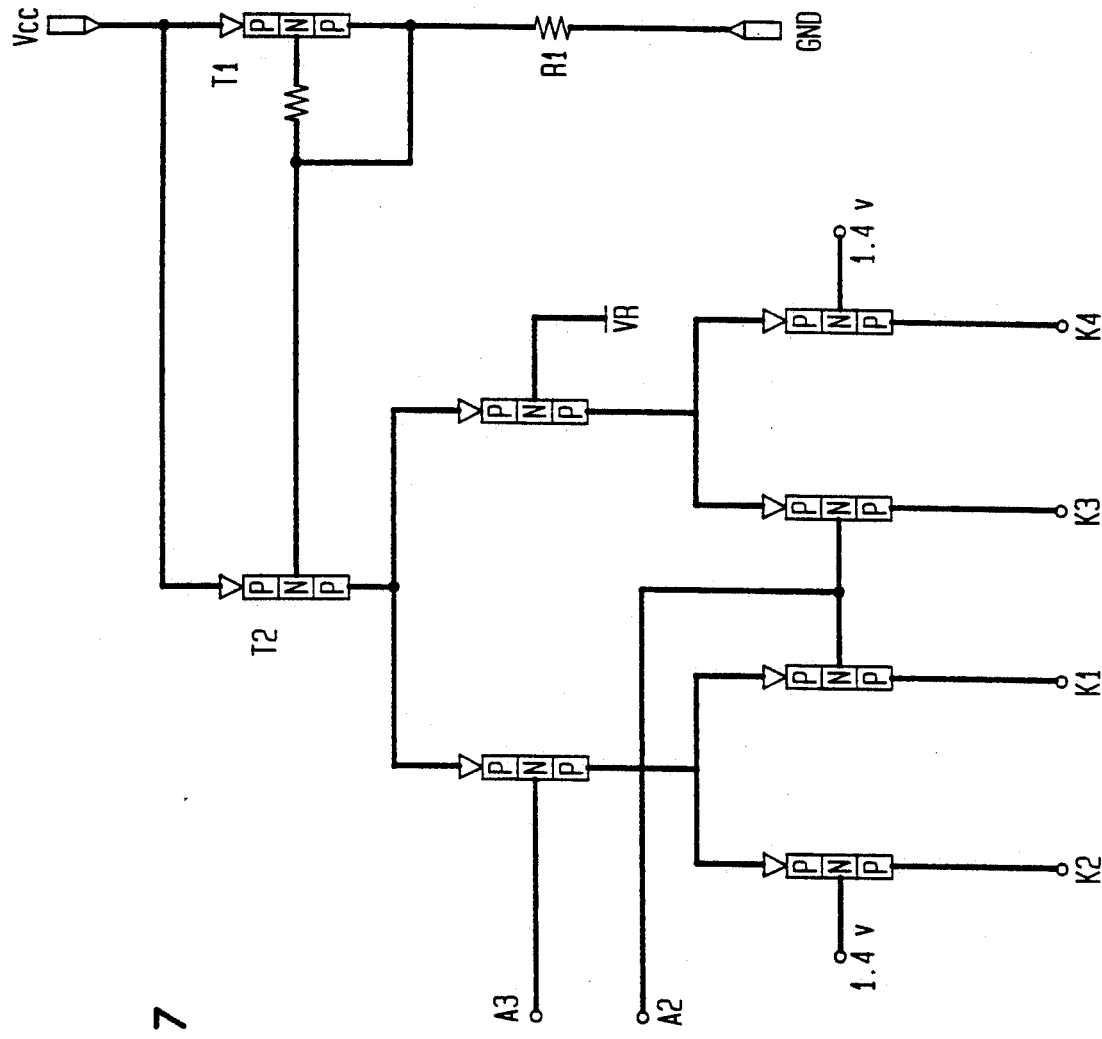
FIG. 7 is a schematic diagram showing lower branches of the current tree up level decoder (ULD) according to the invention.
Figure 8:
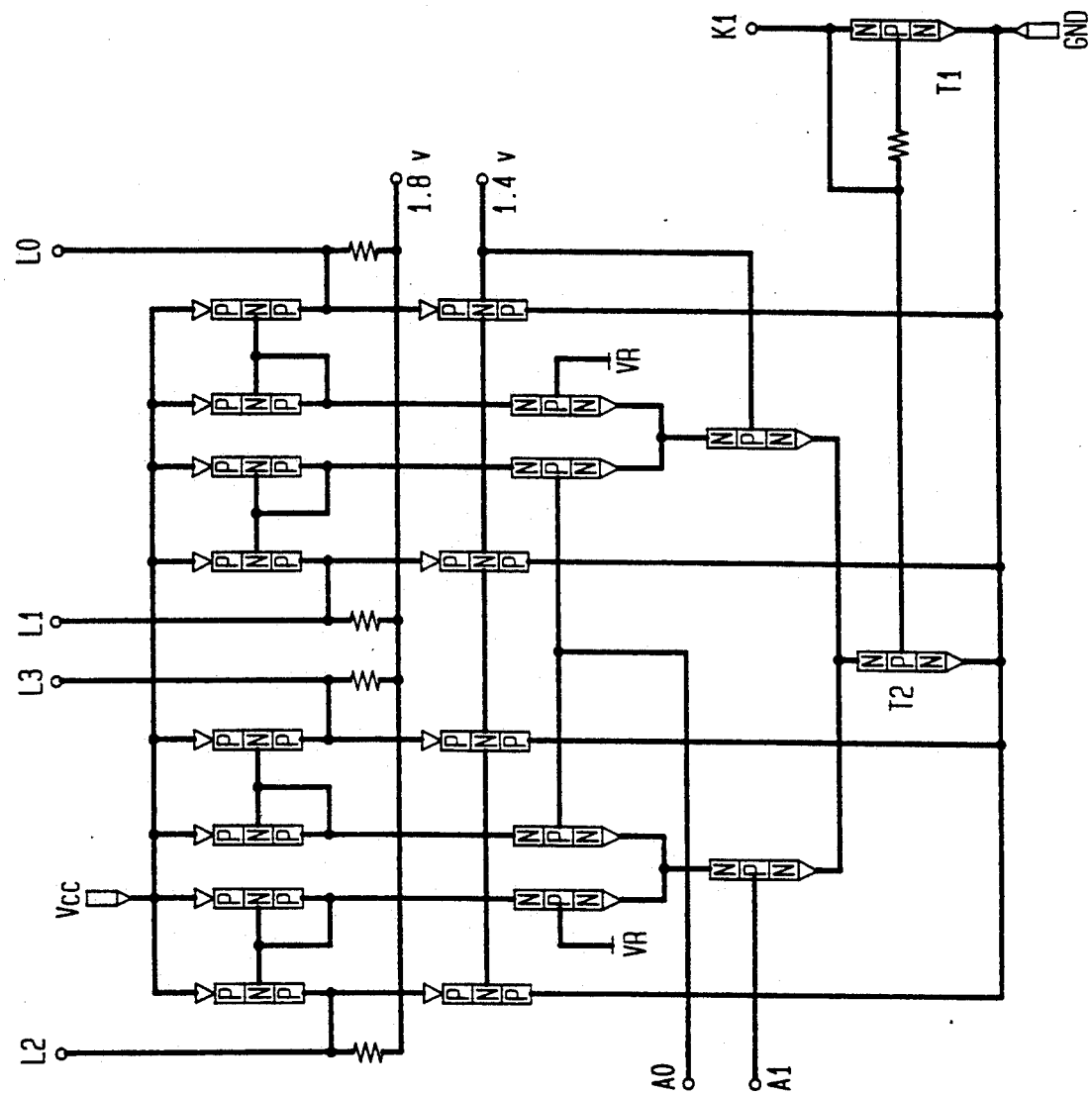
FIG. 8 is a schematic diagram showing higher branches of the current tree up level decoder (ULD) according to the invention.
Figure 9:
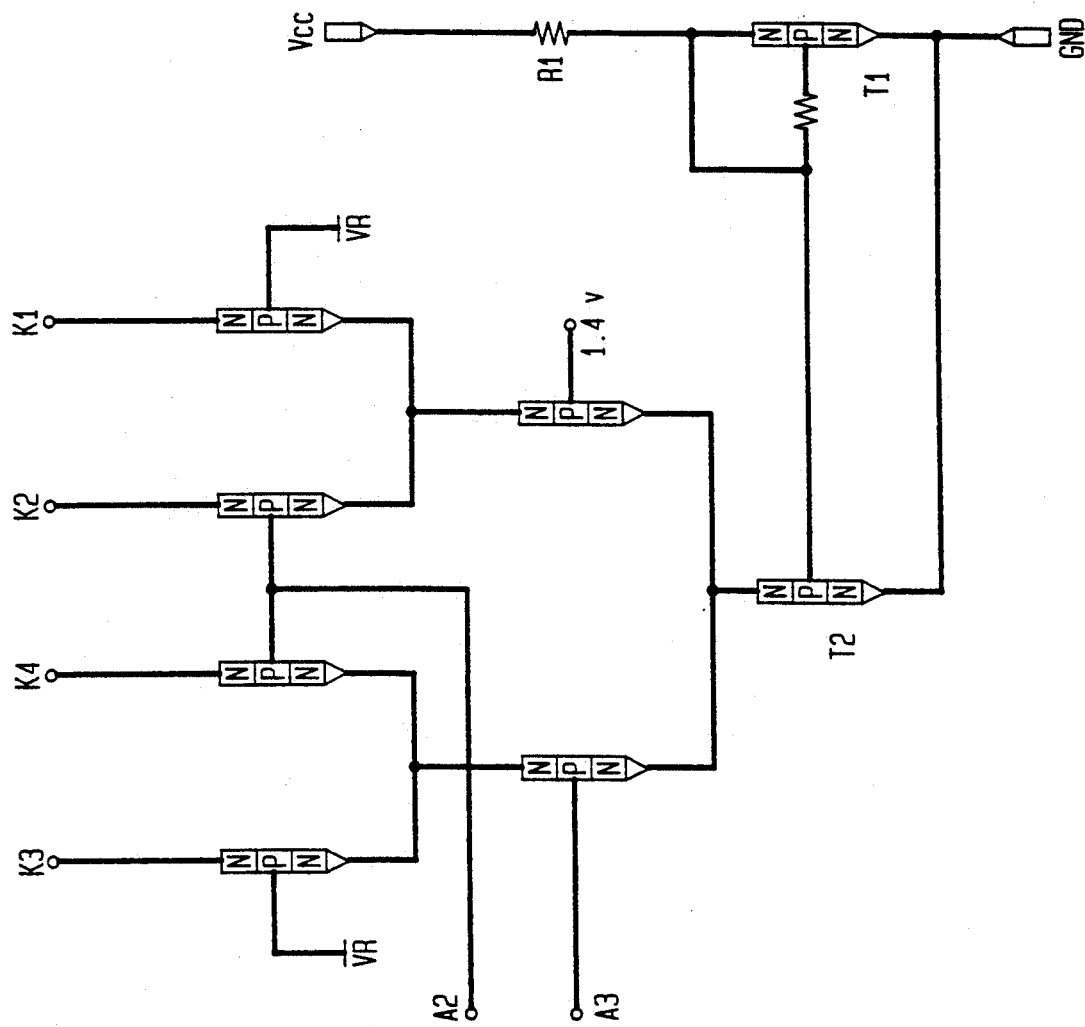
FIG. 9 is a schematic diagram showing lower branches of the current tree down level decoder (DLD) according to the invention.
Figure 10:
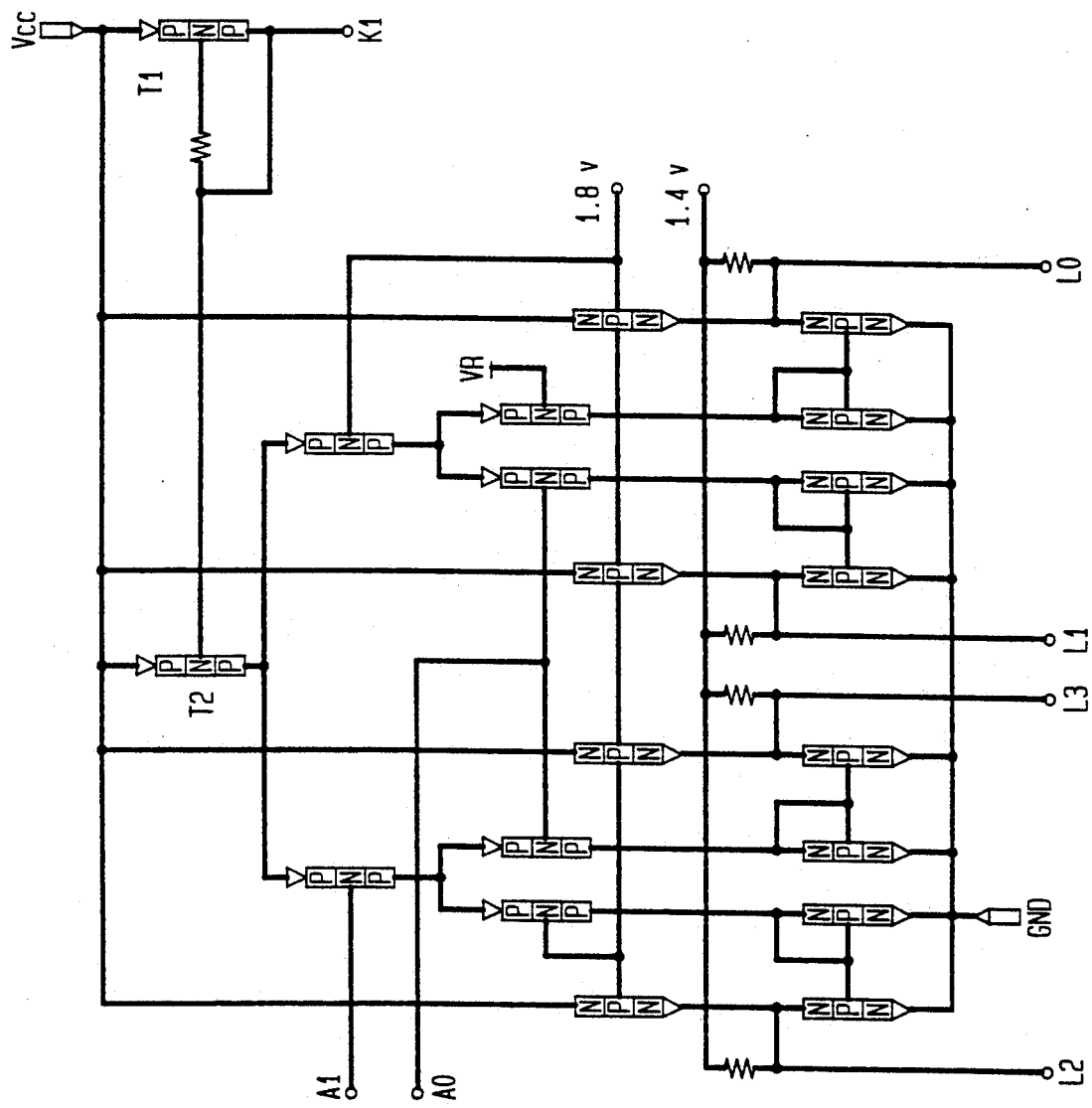
FIG. 10 is a schematic diagram showing higher branches of the current tree down level decoder (DLD) according to the invention.

The implementation of the decoder takes either both of two forms. One implementation provides an up level selected state while the other provides a down level selected state. FIGS. 7 and 8 show the Up Level Decoder (ULD), and FIGS. 9 and 10 show the Down Level Decoder (DLD). FIG. 6 illustrates that only one CTD circuit is required for each group of sixteen decoded lines, and that one group may provide an up level decoded output while the other may provide a down level decoded output.

Referring to FIG. 7, there is shown the trunk of the tree which is the main PNP current transistor T1, followed by two PNP decode levels of branching terminating in four output nodes, K1 through K4. This part of the decoder accepts binary inputs A2 and A3, as generally shown in FIG. 5.

FIG. 8 illustrates one quarter of the remainder of the tree and has one K input node to accept drive from one of the branches of FIG. 7, and has four outputs, L0 through L3 that drive the second decoders. Four of these circuits, each receiving drive from a different FIG. 7 node K output, complete a four input/sixteen output decoder having outputs L0 through L15. NPN transistor T1 accepts current at node K1 and folds it over by mirroring it into NPN transistor T2 which branches out into two more NPN decode levels that terminate in four PNP mirror devices, each driving a PNP pullup current source output device. The collector of each output device has a PNP clamp and a resistor pulldown, each of which connects to supply voltages that determine the output up and down levels. This part of the decoder accepts binary inputs A0 and A1, as generally shown in FIG. 5.

The circuit operates as follows. The value of R1, FIG. 7, is chosen to produce the desired current through transistor T1 which is mirrored into current source transistor T2. The remainder of the devices in FIG. 7 form cascode PNP Emitter Coupled Logic (ECL), decoder circuits that steer current into the appropriate branch of the tree in response to address inputs at nodes A2 and A3. The circuits in FIG. 8 are similar to those in FIG. 7 but use complementary devices. Current from the circuit of FIG. 7 is folded over by mirror transistor T1 and current source transistor T2 which supplies current to the cascode NPN ECL devices that steer the current into the higher branches of the tree in response to address inputs at nodes A0 and A1 to complete the decoding. Only one of the PNP current mirrors that drive output nodes L0 through L3 will receive current since only one main source of current exists and it is steered into only one of the highest branches. This applies to all four of the circuits of FIG. 8 since current is branched from only one of the K outputs of the circuit in FIG. 7 into only one of the four FIG. 8 circuits that form the sixteen output decoder.

Referring next to FIG. 9, there is shown the trunk of the tree which is the main NPN current source transistor T1, followed by two decode levels of branching terminating in four output nodes, K1 through K4. This part of the decoder accepts binary inputs A2 and A3 as generally shown in FIG. 5.

FIG. 10 shows one quarter of the remainder of the tree and has one K input node to accept drive from one of the branches of FIG. 9, and has four outputs L0 through L3 that drive the second decoders. Four of these circuits, each receiving drive from a different FIG. 9 node K output, complete a four input/sixteen output decoder having outputs L0 through L15. PNP transistor T1 accepts current at node K1 and folds it over by mirroring it into PNP transistor T2 which branches out into two more PNP decode levels that terminate in four NPN mirror devices, each driving an NPN pulldown current source output device. The collector of each output device has an NPN clamp and a resistor pullup, each of which connects to supply voltages that determine the output up and down levels. This part of the decoder accepts binary inputs A0 and A1.

The operation of this circuit is similar to that of the ULD show in FIGS. 7 and 8 except that the positions of the NPN and PNP devices are reversed and the direction of the tree is reversed accordingly to produce a down level select mode.

A sixteen output Up Level Decoder (ULD) requires eight A0 inputs, four A1 inputs, two A2 inputs and one A3 input. Only one transistor of each input is active and requires base current drive since current flows in only one branch at time.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A complementary current tree decoder comprising a current tree connected across a voltage supply and having n branching levels, each level receiving a respective binary address $A_i$, $i=1, 2, \ldots, n$, and a highest branching level driving outputs $L_j$, $j=1, 2, \ldots, 2^n$, said binary address steering current through the branches of the tree to a corresponding output, said current tree being divided into two groups of branching levels, a first one of said groups comprising a current source and lower branching levels and having transistors of a first conductivity type, a second one of said groups comprising higher branching levels having transistors of a second conductivity type complementary to said first conductivity type, current from said first one of said groups being folded over by current mirrors to said second one of said groups, the flow of current through said current tree being extended over a greater total voltage range than the supply voltage and power dissipation being low due to current flowing in only one branch of the tree at a time.

2. The complementary current tree decoder recited in claim 1 wherein said transistors are bipolar transistors.

3. The complementary current tree decoder recited in claim 2 wherein $n=4$.

4. The complementary current tree decoder recited in claim 3 wherein said second one of said groups further comprises transistors of said first conductivity type configured as a current source and clamp for each of said outputs.

5. The complementary current tree decoder recited in claim 4 wherein the transistors of said first conductivity type are PNP transistors and the transistors of said second conductivity type are NPN transistors.

6. The complementary current tree decoder recited in claim 4 wherein the transistors of said first conductivity type are NPN transistors and the transistors of said second conductivity type are PNP transistors.

7. The complementary current tree decoder recited in claim 4 wherein two complementary tree decoders are combined to form a 256 output decoder for an 8-bit address, a first one of said two complementary tree decoders being an up level decoder in which the transistors of said first conductivity type are PNP transistors and the transistors of said second conductivity type are NPN transistors, said up level decoder receiving the first four bits of said 8-bit address, and the second one of said two complementary tree decoders being a down level decoder in which the transistors of said first conductivity type are NPN transistors and the transistors of said second conductivity type are PNP transistors, said down level converter receiving the second four bits of said 8-bit address.

* * * * *